US008156461B2

(12) United States Patent
Wakita et al.

(10) Patent No.: US 8,156,461 B2
(45) Date of Patent: Apr. 10, 2012

(54) SPICE CORNER MODEL GENERATING METHOD AND APPARATUS

(75) Inventors: Naoki Wakita, Kawasaki (JP); Sadayuki Yoshitomi, Tokyo (JP); Fumie Fujii, Yokohama (JP); Yuka Itano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 12/881,020

(22) Filed: Sep. 13, 2010

(65) Prior Publication Data

US 2011/0131541 A1 Jun. 2, 2011

(30) Foreign Application Priority Data

Nov. 30, 2009 (JP) ................................ 2009-272497

(51) Int. Cl.
*G06F 17/50* (2006.01)

(52) U.S. Cl. ...................................................... 716/110

(58) Field of Classification Search .................. 716/110
See application file for complete search history.

(56) References Cited

U.S. PATENT DOCUMENTS

| | | | | |
|---|---|---|---|---|
| 6,606,729 | B2 * | 8/2003 | Gross et al. | 716/50 |
| 2003/0066034 | A1 * | 4/2003 | Gross et al. | 716/1 |
| 2010/0095259 | A1 * | 4/2010 | Tetelbaum | 716/6 |
| 2011/0219348 | A1 * | 9/2011 | Liu | 716/132 |

FOREIGN PATENT DOCUMENTS

JP 2002-043429 A 2/2002

OTHER PUBLICATIONS

Background Art Information.

* cited by examiner

*Primary Examiner* — Suchin Parihar
(74) *Attorney, Agent, or Firm* — Knobbe, Martens, Olson & Bear LLP

(57) ABSTRACT

In one embodiment, a SPICE corner model generating method for generating a SPICE corner model of an MOSFET includes preparing a table of a ratio X regarding a combination of two kinds of MOSFETs selected from N kinds of MOSFETs, the ratio X being a magnitude of a variation of an MOSFET in a case where directions of variations of the two kinds of MOSFETs are opposite directions to a magnitude of a variation of an MOSFET in a case where the directions of the variations of the two kinds of MOSFETs are the same direction, where N is an integer of 2 or greater. The method further includes reading out, when a combination of two kinds of MOSFETs is designated among the N kinds of MOSFETs, a value of the ratio X corresponding the designated combination from the table of the ratio X. The method further includes forming two kinds of corner models of opposite directional variations, the two kinds of corner models including a first corner model generated by applying the value of the ratio X to a fast-side corner of a first MOSFET of the two kinds of MOSFETs and to a slow-side corner of a second MOSFET of the two kinds of MOSFETs, and a second corner model generated by applying the value of the ratio X to a slow-side corner of the first MOSFET and to a fast-side corner of the second MOSFET.

19 Claims, 7 Drawing Sheets

X

β α

| | | SECOND MOSFET | | | | | |
|---|---|---|---|---|---|---|---|
| | | M1 | M2 | M3 | M4 | • • • | Mn |
| FIRST MOSFET | M1 | — | ? | ? | ? | • • • | ? |
| | M2 | ? | — | ? | ? | • • • | ? |
| | M3 | ? | ? | — | ? | • • • | ? |
| | M4 | ? | ? | ? | — | • • • | ? |
| | ⋮ | ⋮ | ⋮ | ⋮ | ⋮ | ⋱ | ⋮ |
| | Mn | ? | ? | ? | ? | • • • | — |

Y

| | | | SECOND MOSFET | | | | | | | | | |
|---|---|---|---|---|---|---|---|---|---|---|---|---|
| | | | THIN FILM | | | | | | THICK FILM | | | |
| | | | N1 | P1 | N2 | P2 | N3 | P3 | N4 | P4 | N5 | P5 |
| FIRST MOSFET | THIN FILM | N1 | — | 1 | ? | 1 | ? | 1 | ? | 1 | ? | 1 |
| | | P1 | 1 | — | 1 | ? | 1 | ? | 1 | ? | 1 | ? |
| | | N2 | ? | 1 | — | 1 | ? | 1 | ? | 1 | ? | 1 |
| | | P2 | 1 | ? | 1 | — | 1 | ? | 1 | ? | 1 | ? |
| | | N3 | ? | 1 | ? | 1 | — | 1 | ? | 1 | ? | 1 |
| | | P3 | 1 | ? | 1 | ? | 1 | — | 1 | ? | 1 | ? |
| | THICK FILM | N4 | ? | 1 | ? | 1 | ? | 1 | — | 1 | ? | 1 |
| | | P4 | 1 | ? | 1 | ? | 1 | ? | 1 | — | 1 | ? |
| | | N5 | ? | 1 | ? | 1 | ? | 1 | ? | 1 | — | 1 |
| | | P5 | 1 | ? | 1 | ? | 1 | ? | 1 | ? | 1 | — |

| | | | SECOND MOSFET | | | | | | | | | |
|---|---|---|---|---|---|---|---|---|---|---|---|---|
| | | | THIN FILM | | | | | | THICK FILM | | | |
| | | | N1 | P1 | N2 | P2 | N3 | P3 | N4 | P4 | N5 | P5 |
| FIRST MOSFET | THIN FILM | N1 | — | 0 | 0 | 0 | 0 | 0 | 1 | 1 | 1 | 1 |
| | | P1 | 0 | — | 0 | 0 | 0 | 0 | 1 | 1 | 1 | 1 |
| | | N2 | 0 | 0 | — | 0 | 0 | 0 | 1 | 1 | 1 | 1 |
| | | P2 | 0 | 0 | 0 | — | 0 | 0 | 1 | 1 | 1 | 1 |
| | | N3 | 0 | 0 | 0 | 0 | — | 0 | 1 | 1 | 1 | 1 |
| | | P3 | 0 | 0 | 0 | 0 | 0 | — | 1 | 1 | 1 | 1 |
| | THICK FILM | N4 | 1 | 1 | 1 | 1 | 1 | 1 | — | 0 | 0 | 0 |
| | | P4 | 1 | 1 | 1 | 1 | 1 | 1 | 0 | — | 0 | 0 |
| | | N5 | 1 | 1 | 1 | 1 | 1 | 1 | 0 | 0 | — | 0 |
| | | P5 | 1 | 1 | 1 | 1 | 1 | 1 | 0 | 0 | 0 | — |

FIG. 9

SPICE CORNER MODEL GENERATING METHOD AND APPARATUS

CROSS REFERENCE TO RELATED APPLICATION

This application is based upon and claims the benefit of priority from the prior Japanese Patent Application No. 2009-272497, filed on Nov. 30, 2009, the entire contents of which are incorporated herein by reference.

FIELD

Embodiments described herein relate to a SPICE (Simulation Program with Integrated Circuit Emphasis) corner model generating method and apparatus, for example, for generating a corner model for a case where electrical characteristics of MOSFETs vary in opposite directions.

BACKGROUND

MOSFET corner models for SPICE circuit simulations are used to verify circuit operations when electrical characteristics of MOSFETs vary to a maximum extent due to a variation in production. A MOSFET is a semiconductor device that has four terminals, i.e., a gate terminal, a source terminal, a drain terminal, and a substrate terminal. The electrical characteristics of a MOSFET are represented for example by the magnitude of the current (drain current) that flows in the drain terminal when a voltage is applied to those terminals.

Indicators that define the electrical characteristics of each MOSFET include a threshold voltage and an on-current. The threshold voltage is the magnitude of the gate voltage at which the drain current starts flowing. The on-current is the magnitude of the drain current observed when a supply voltage is applied between the gate terminal and the source terminal, and between the drain terminal and the source terminal.

Corner models are generated, normally with variations in the threshold voltage and the on-current being taken into consideration. In the following, a case where variations in the on-current are taken into consideration is explained, but the same concept may be applied to the threshold voltage and other indicators. The on-current varies in the two directions, the one in which the on-current becomes larger than the reference value, and the other in which the on-current becomes smaller than the reference value.

If one kind of MOSFET is used in the circuit, two corner models corresponding to the maximum variation width in the two directions are prepared, and operation verification is performed on respective circuit characteristics with the two corner models. If two kinds of MOSFETs are used in the circuit, each of the two kinds of MOSFETs has a variation in two directions, and therefore, the number of combinations of corners is $2^2=4$ in total.

If the two kinds of MOSFETs do not interfere each other, the four corner models formed by combining the two corner models of one of the MOSFETs with the two corner models of the other should be evaluated. In practice, however, there is a correlation between the on-current variations of the two kinds of MOSFETs. The on-currents of two kinds of MOSFETs sometimes vary in the same directions (or become larger or smaller at the same time), and sometimes vary in opposite directions (the on-current of one of the two kinds of MOSFETs becomes larger while the on-current of the other becomes smaller). Normally, the on-currents tend to vary in the same directions, and rarely vary in opposite directions.

The reasons for that are as follows. The principal causes of on-current variations are the length L of the gate electrode, the width W of the gate electrode, the thickness Tox of the gate insulator, and the impurity concentration Nch in the channel portion of the MOSFET. Among those causes, the length L, the width W, and the thickness Tox tend to vary in the same directions with respect to the respective reference values, since the gate electrodes and the gate insulators of MOSFETs of different kinds are formed through the same manufacturing procedures. Therefore, as for L, W, and Tox, there are strong correlations between the variations of two kinds of MOSFETs. Meanwhile, introduction of impurities into the channel portion for controlling the threshold voltage in MOSFETs of different kinds is performed in separate manufacturing procedures from one another. Accordingly, there is only a small correlation between the Nch variations of two kinds of MOSFETs. As a result, L, W, and Tox contribute to the variations in the same directions, but only Nch contributes to the variations in the opposite directions. When the same directional variations and the opposite directional variations are compared with each other, the magnitude of the variations in the opposite directions is smaller than the magnitude of the variations in the same directions.

Here, an NFET and a PFET that have substantially same absolute values in threshold voltage and form a pair are described as an example of two different MOSFETs. The on-current variations are assumed to be larger in the same directions and smaller in opposite directions in those MOSFETs.

In a MOSFET corner model for SPICE circuit simulations, the distribution of the on-current variations of those MOSFETs is expressed in X-Y coordinates, with the X-coordinate indicating the on-current of the NFET, the Y-coordinate indicating the on-current of the PFET. Here, the variation distribution is represented by an elliptic form, because the on-current variations of those MOSFETs are larger in the same directions and are smaller in opposite directions.

With the properties of the on-current variations being taken into consideration, the two corner models (FF and SS) of cases where the absolute values of the on-currents of the NFET and the PFET vary in the same directions are set with greater corner widths than the two corner models (FS and SF) of cases where the absolute values of the on-currents vary in opposite directions. Here, the corner width is the distance from the typical model (TT) equivalent to the reference value of those on-currents to each corner model. In the X-Y coordinates, TT is located at the center point of the ellipse, FF and SS are located on the long axis of the ellipse, and FS and SF are located on the short axis of the ellipse.

Normally, the corner models corresponding to the same directional variations are the corner models of the corner widths having the influence of all the causes of variation. On the other hand, the corner models corresponding to the opposite directional variations have corner widths attributed to the causes of the opposite directional variations generated only in the manufacturing procedures applied to the two kinds of MOSFETs independently of each other. The variations attributed only to the independently applied manufacturing procedures are the variations only in impurity concentration or the variations in impurity concentration and gate insulator thickness, for example.

The corner models prepared as above are put into one library for each one direction of the two same directions and two opposite directions. As a result, each library contains one corner model of each MOSFET. For example, in the library "FS", one NFET appears only once, and the corner model of the NFET is the corner model corresponding to the magnitude of the opposite directional variations observed when a pair is formed by combining the NFET with a PFET having substantially same absolute value of the threshold voltage as the NFET.

However, the conventional technique has the following drawbacks.

For example, a differential amplifier circuit formed by combining two low-Vth NFETs each having a low threshold voltage with a high-Vth NFET having a high threshold voltage is now described. To secure the current driving force for the differential pair portion in this circuit, low-Vth (low threshold voltage, large on-current) NFETs are used. For the other portions, a high-Vth (high threshold voltage, small leakage current and small on-current) NFET is used to reduce leakage.

One of the requirements for performing operation verification to check the influence of variations in this circuit is that the on-currents of the low-Vth NFETs are smallest while the leakage current and the on-current of the high-Vth NFET are largest. This is equivalent to operation verification performed on the opposite directional variations of the low-Vth NFETs and the high-Vth NFET.

However, for such a combination of low-Vth NFETs and a high-Vth NFET, corner models for appropriately verifying an operation where the on-currents vary in opposite directions are normally not prepared, though such corner models are prepared for an NFET and a PFET that have substantially same absolute values in threshold voltage and form a pair as described above. Therefore, circuit operation verification cannot be performed with the use of corner models.

In a case where an operation with the same directional variations, instead of the opposite directional variations, is verified, operation verification can be performed by using a combination of the corner models of the NFET from the corner models of the same directional variations of a low-Vth NFET and PFET, with the corner models of the NFET from the corner models of the same directional variations of a high-Vth NFET and PFET.

However, the corner widths of opposite directional variations vary among combinations of MOSFETs, and the same combination cannot be applied to them. Therefore, to perform operation verification with the opposite directional variations of the above described example case, a Monte Carlo simulation that requires a long period of time needs to be performed, and circuit operation verification cannot be performed in a short TAT (Turn Around Time). A Monte Carlo simulation is a technique for evaluating the thousands of simulation results and the distribution of circuit characteristics by repeating a circuit characteristics simulation thousands of times while providing random numbers to the physical parameters corresponding to the gate length, the gate width, the gate insulator thickness, and the channel impurity concentration in the MOSFET model.

Meanwhile, it is difficult to prepare corner models of opposite directional variations for all the combinations of MOSFETs, because of the structures and configurations of libraries. Normally, a corner model of each MOSFET appears only once in each library and each corner model is referred to by "library name×MOSFET name". Therefore, the combination of an A-NFET and an A-PFET and the combination of an A-NFET and a B-NFET cannot be included as the corner models of the opposite directional variations of A-NFETs in the library "FS", since two A-NFETs cannot be included at the same time.

As described above, for combinations of MOSFETs other than the combination of an NFET and a PFET having substantially same absolute values in threshold voltage, circuit operation verification taking opposite directional variations into consideration cannot be performed in a short TAT with the use of SPICE corner models.

JP-A 2002-43429 (KOKAI) discloses a simulation method for determining variations in the device parameters of the corners by determining the device parameter sensitivity through a circuit simulation and applying the device parameter sensitivity and the values of electrical characteristics required for the corners to have, to the normal equation of the linear least-squares method.

BRIEF DESCRIPTION OF THE DRAWINGS

FIG. 8 is a diagram showing an example of a table of a ratio Y; and

FIG. 9 is a diagram showing an example of a table of a ratio Z.

DETAILED DESCRIPTION

Embodiments will now be explained with reference to the accompanying drawings.

An embodiment described herein is, for example, a SPICE corner model generating method for generating a SPICE corner model of an MOSFET. The method includes preparing a table of a ratio X regarding an arbitrary combination of two kinds of MOSFETs selected from N kinds of MOSFETs, the ratio X being a magnitude of a variation of an MOSFET in a case where directions of variations of the two kinds of MOSFETs are opposite directions to a magnitude of a variation of an MOSFET in a case where the directions of the variations of the two kinds of MOSFETs are the same direction, where N is an integer of 2 or greater. The method further includes reading out, when a combination of two kinds of MOSFETs is designated among the N kinds of MOSFETs, a value of the ratio X corresponding the designated combination from the table of the ratio X. The method further includes forming two kinds of corner models of opposite directional variations, the two kinds of corner models including a first corner model generated by applying the value of the ratio X to a fast-side corner of a first MOSFET of the two kinds of MOSFETs and to a slow-side corner of a second MOSFET of the two kinds of MOSFETs, and a second corner model generated by applying the value of the ratio X to a slow-side corner of the first MOSFET and to a fast-side corner of the second MOSFET.

Another embodiment described herein is, for example, a SPICE corner model generating apparatus configured to generate a SPICE corner model of an MOSFET. The apparatus includes a ratio table storage part configured to store a table of a ratio X regarding an arbitrary combination of two kinds of MOSFETs selected from N kinds of MOSFETs, the ratio X being a magnitude of a variation of an MOSFET in a case where directions of variations of the two kinds of MOSFETs are opposite directions to a magnitude of a variation of an MOSFET in a case where the directions of the variations of the two kinds of MOSFETs are the same direction, where N is an integer of 2 or greater. The apparatus further includes a ratio reading part configured to read out, when a combination of two kinds of MOSFETs is designated among the N kinds of MOSFETs, a value of the ratio X corresponding to the designated combination from the table of the ratio X. The apparatus further includes a corner model forming part configured to form two kinds of corner models of opposite directional variations, the two kinds of corner models including a first corner model generated by applying the value of the ratio X to a fast-side corner of a first MOSFET of the two kinds of MOSFETs and to a slow-side corner of a second MOSFET of the two kinds of MOSFETs, and a second corner model generated by applying the value of the ratio X to a slow-side corner of the first MOSFET and to a fast-side corner of the second MOSFET.

(First Embodiment)

Figure 1:
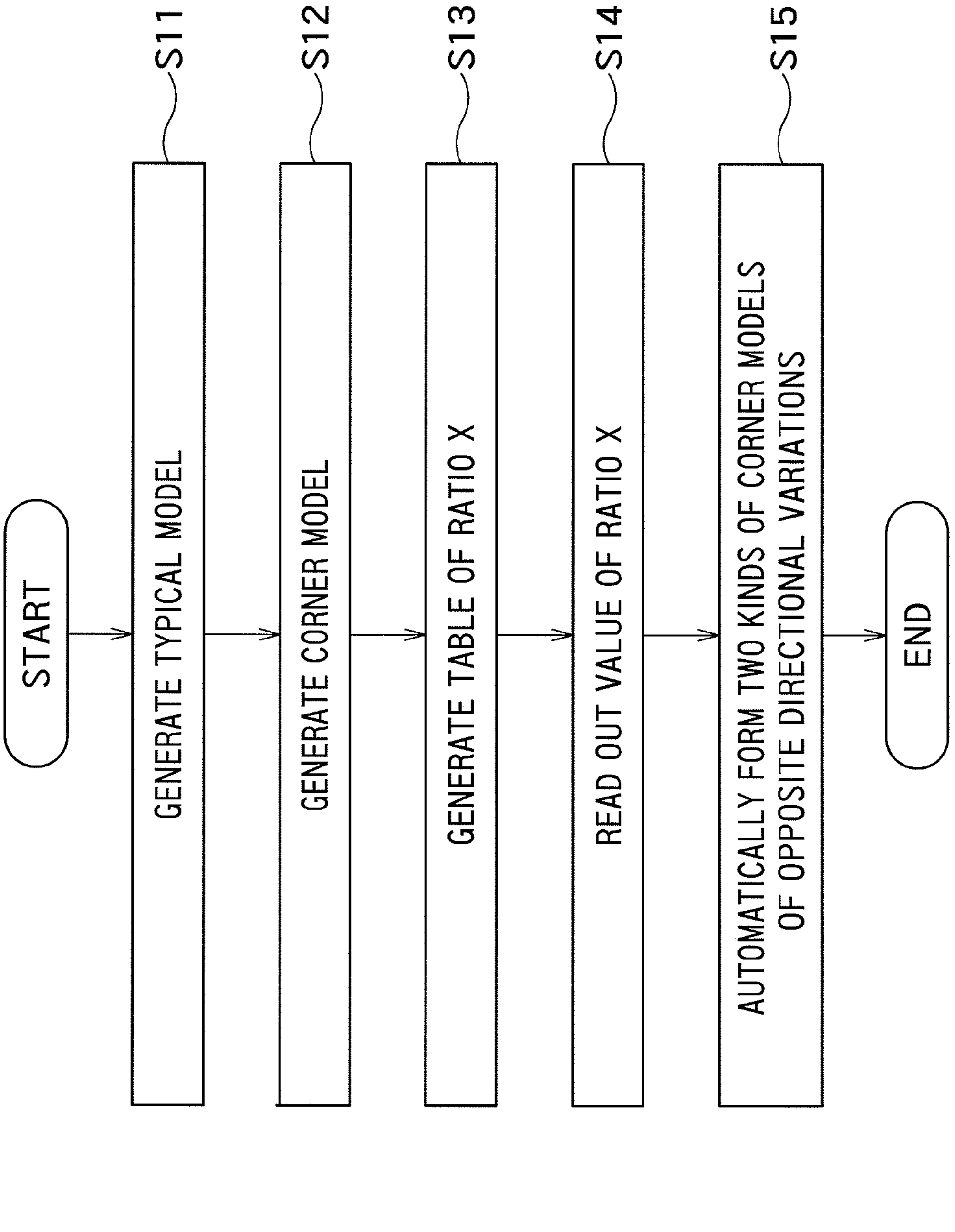
FIG. 1 is a flowchart for explaining a SPICE corner model generating method according to a first embodiment.

FIG. 1 is a flowchart for explaining a SPICE corner model generating method according to a first embodiment.

In this embodiment, it is assumed that one technology involves N kinds of MOSFETs, where N is an integer of 2 or greater. In the flow illustrated in FIG. 1, corner models for verifying operations are formed through the procedures of steps S11 to S15, with the opposite directional variations of arbitrary combinations of MOSFETs being taken into consideration.

First, at step S11, a typical model corresponding to a case where variations are not taken into consideration is generated for each of the N kinds of MOSFETs.

At step S12, values of one or more model parameters of the typical model of each of the N kinds of MOSFETs are varied, to generate corner models corresponding to a case where the electrical characteristics of the MOSFETS vary. In this embodiment, the on-current is used as an indicator that defines the electrical characteristics of each MOSFET.

There are two directions of variation in the electrical characteristics of each MOSFET. At step S12, two corner models of the fast-side corner and the slow-side corner are generated for each of the N kinds of MOSFETs. Here, the model parameters having the values varied at step S12 are referred to as skew parameters, and the corner models generated at step S12 are referred to as skew corner models. In this embodiment, the variation widths of the skew parameters are dynamically and uniformly multiplied by X, so that the corner widths of the corner models become variable.

Figure 2:
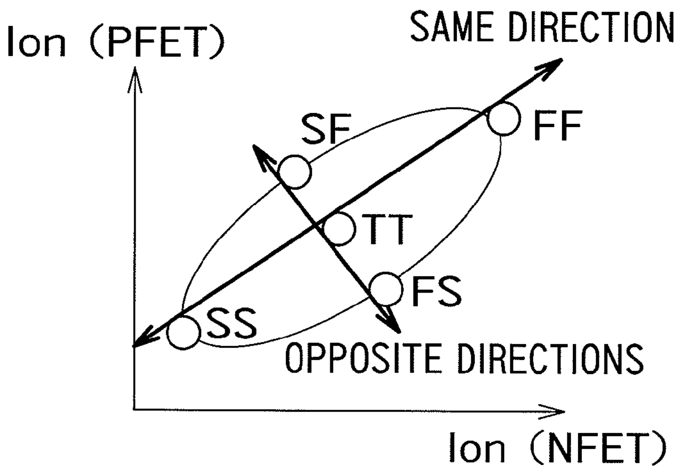
FIG. 2 is a diagram showing an example of a distribution of variations in on-current values of an NFET and a PFET.
Figure 3:
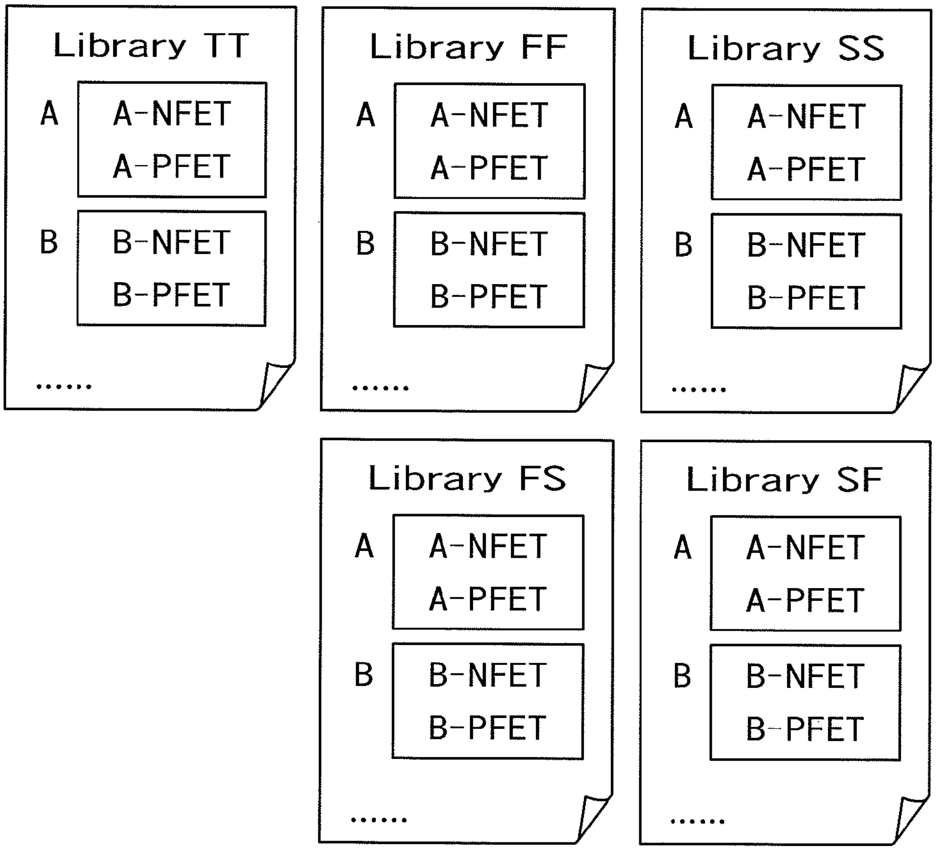
FIG. 3 is a diagram showing examples of libraries that manage information about MOSFETs.

At step S13, a variation state of the on-current values (a distribution of the on-current values) of arbitrary combinations of two kinds of MOSFETs among the N kinds of MOSFETs is examined. Specifically, as shown in FIG. 2, the abscissa axis of two-dimensional coordinates indicates the on-current value of one of the MOSFETs (an NFET in this case), and the ordinate axis indicates the on-current value of the other MOSFET (a PFET in this case). The distribution of variations in the on-current value is examined. FIG. 2 is a diagram showing an example of the distribution of variations in on-current values of an NFET and a PFET. FIG. 3 is a diagram showing examples of libraries that manage the information about those MOSFETs. FIG. 3 shows four kinds of MOFSETs (an A-NFET, an A-PFET, a B-NFET, and a B-PFET) as examples of the N kinds of MOSFETs.

To examine the distribution of variations, the characteristics of TEG formed on an actual semiconductor wafer may be examined, a simulation may be performed by a TCAD (Technology Oriented CAD), or any other method for checking the correlation between variations may be used.

At step S13, the ratio X between the magnitude of the same directional variations and the magnitude of the opposite directional variations is calculated based on the distribution of variation examined in the above manner. More specifically, the ratio X is the magnitude of a variation of an MOSFET in a case where two kinds of MOSFETs selected as an arbitrary combination from the N kinds of MOSFETs have variations in the same direction to the magnitude of a variation of an MOSFET in a case where the two kinds of MOSFETs have variations in opposite directions. When being expressed with a variation width, the ratio X is obtained by dividing the opposite directional variation width by the same directional variation width, and the value of the ratio X normally falls into the range, $0 \leqq X \leqq 1$.

Figures 4, 5:
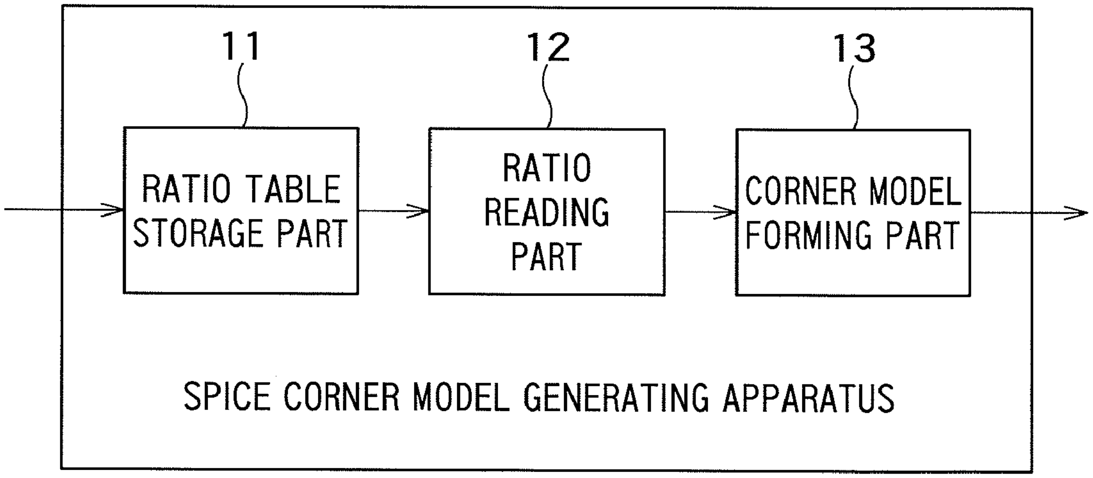
FIG. 4 is a diagram showing an example of a table of a ratio X.
FIG. 5 is a block diagram showing a first example of a configuration of a SPICE corner model generating apparatus according to the first embodiment.

At step S13, a table of the ratio X is further formed, so as to hold information that contains values of the ratio X calculated for arbitrary combinations. FIG. 4 is a diagram showing an example of a table of the ratio X. For example, where a first MOSFET of the two kinds of MOSFETs is M1, and a second MOSFET is M2, the value of the ratio X between those MOSFETs is the value shown in the column denoted by α. The value of the ratio X obtained where the first and second MOSFETs are M1 and M2, respectively, is the same as the value of the ratio X obtained where the first and second MOSFETs are M2 and M1, respectively. Therefore, the value shown in the column denoted by α is the same as the value shown in the column denoted by β.

At step S14, if a combination of two kinds of MOSFETs is designated among the N kinds of MOSFETs by a user or the like while a SPICE circuit simulation is being performed, the table of the ratio X is referred to, and a value of the ratio X corresponding to the designated combination is read out from the table. For example, if the combination of M1 and M2 shown in FIG. 4 is designated, a value of the ratio X shown in the column denoted by α or β is read out.

At step S15, for the above two kinds of MOSFETs, two kinds of corner models corresponding to opposite directional variations are automatically formed by multiplying the variation width of the value of each skew parameter from the value of the typical model by the ratio X.

At this point, a first corner model of the two kinds of corner models is formed by applying the value of the ratio X to the fast-side corner of the first MOSFET of the two kinds of MOSFETs, and to the slow-side corner of the second MOSFET. More specifically, the first corner model is generated by combining a result obtained by multiplying the variation widths of the skew parameters of the fast-side corner model of the first MOSFET by X, with a result obtained by multiplying the variation widths of the skew parameters of the slow-side corner model of the second MOSFET by X.

The second corner model of the two kinds of corner models is also generated by applying the value of the ratio X to the slow-side corner of the first MOSFET of the two kinds of MOSFETs, and to the fast-side corner of the second MOSFET. More specifically, the second corner model is generated by combining a result obtained by multiplying the variation widths of the skew parameters of the slow-side corner model of the first MOSFET by X, with a result obtained by multiplying the variation widths of the skew parameters of the fast-side corner model of the second MOSFET by X.

In this manner, the two corner models corresponding to both sides of the opposite directional variations are formed at step S15. At step S15, the typical model and the corner models generated at step S11 and step S12 are used, and the value of the ratio X generated at step S13 and read out at step S14 is used.

As described above, in this embodiment, corner models having corner widths that are dynamically variable, and a table that holds the values of ratios X between the magnitudes of the same directional variations and the magnitudes of the opposite directional variations are prepared in advance. While a circuit simulation is being performed, the corresponding value in the table is referred to, and the necessary corner models of the opposite directional variations are dynamically formed from the above corner models, in accordance with the combinations of the MOSFETs used in the subject circuit.

By the conventional method, where an arbitrary combination of two kinds of MOSFETs is selected from the N kinds of MOSFETs, and the opposite directional variations of the selected combination are handled, it is necessary to prepare ${}_NC_2$ corner models of opposite directional variations, since there are ${}_NC_2$ combinations of MOSFETs. Therefore, the conventional method has the problem that the data amount of those corner models becomes larger, and reading those corner models is time-consuming. Further, the conventional method has the problem that it is difficult to prepare those corner models, due to the structure and configuration of the libraries.

In this embodiment, on the other hand, a table of the values of the ratio X is prepared, and necessary corner models of the opposite directional variations are dynamically formed with the use of the table while a circuit simulation is being performed. The data amount in the table of the ratio X is much smaller than the data amount in the corner models, and the time required for reading the values of the ratio X is much shorter than the time required for reading the data of the corner models. Accordingly, this embodiment has advantages that the amount of data prepared beforehand is smaller, and the reading time is shorter.

Also, in this embodiment, the necessary corner models of the opposite directional variations can be formed through a relatively simple operation in which the variation widths of various skew parameters are multiplied by X. In this manner, this embodiment has an advantage that the necessary corner models of the opposite directional variations can be relatively readily formed by applying the values of the ratio X to the skew corner models.

Figure 6:
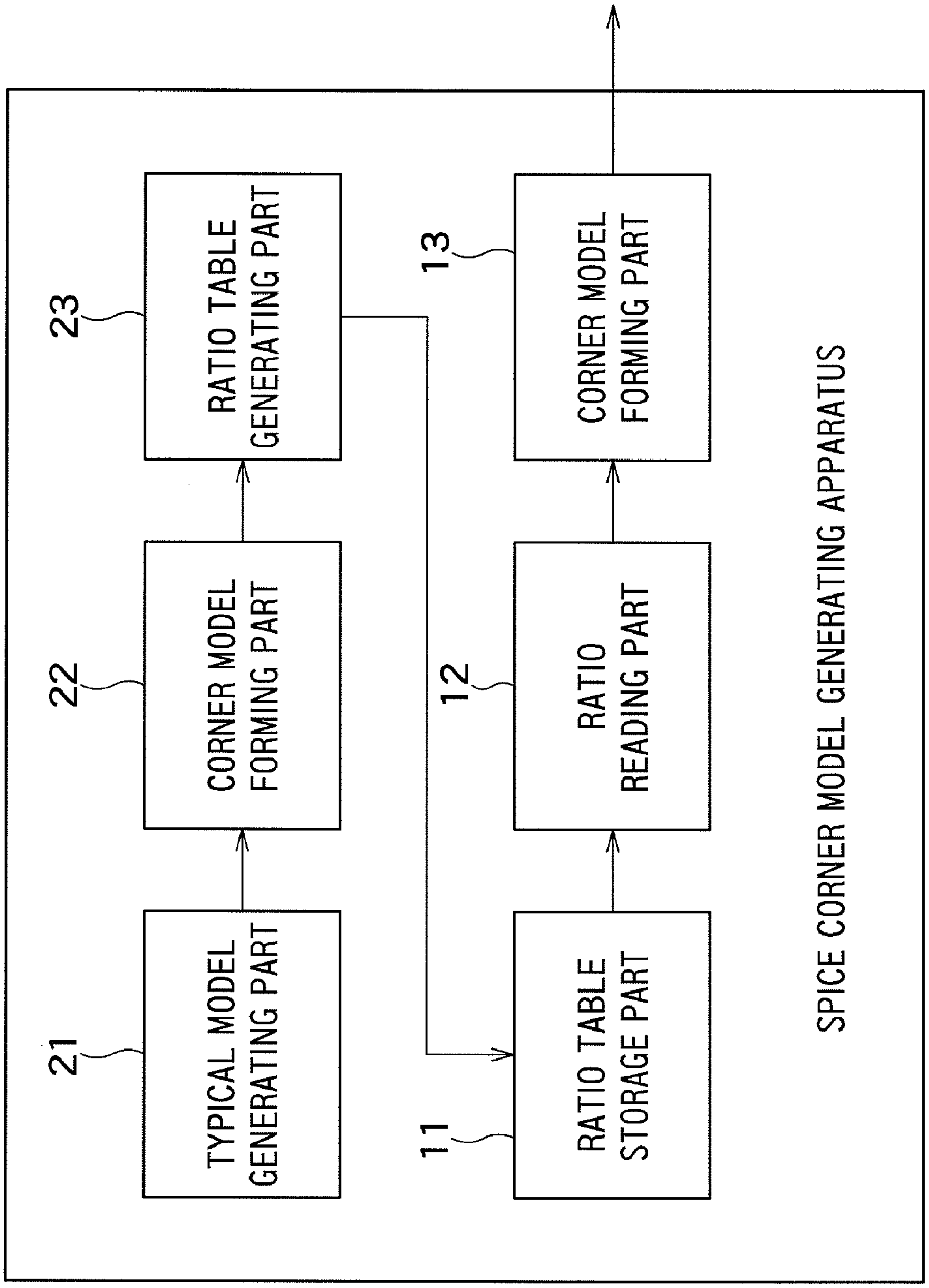
FIG. 6 is a block diagram showing a second example of the configuration of the SPICE corner model generating apparatus according to the first embodiment.

All the steps in the SPICE corner model generating method illustrated in FIG. 1 may be carried out by a computer, or the procedures of steps S14 and S15 may be carried out by a computer while the procedures of steps S11 to S13 are carried out by a human. Referring now to FIGS. 5 and 6, examples of apparatuses that are capable of implementing the SPICE corner model generating method illustrated in FIG. 1 are described.

FIG. 5 is a block diagram showing a first example of a configuration of a SPICE corner model generating apparatus according to the first embodiment. The SPICE corner model generating apparatus of FIG. 5 includes a ratio table storage part 11, a ratio reading part 12, and a corner model forming part 13.

In the example illustrated in FIG. 5, the procedures of steps S11 to S13 are carried out by a human. The table of the ratio X generated at step S13 is stored into the ratio table storage part 11. After that, while a SPICE circuit simulation is being performed, a combination of two kinds of MOSFETs among the N kinds is designated by a user, and the ratio reading part 12 reads the value of the ratio X corresponding to the designated combination from the above table (step S14). At step S15, the corner model forming part 13 automatically forms the two kinds of corner models corresponding to the opposite directional variations, using the value of the corresponding ratio X. In this manner, the necessary corner models are formed.

FIG. 6 is a block diagram showing a second example of the configuration of the SPICE corner model generating apparatus according to the first embodiment. The SPICE corner model generating apparatus of FIG. 6 includes a typical model generating part 21, a corner model generating part 22, and a ratio table generating part 23, in addition to the blocks shown in FIG. 5.

In the example illustrated in FIG. 6, the procedures of steps S11 to S13 are carried out by the typical model generating part 21, the corner model generating part 22, and the ratio table generating part 23, respectively. More specifically, the typical model generating part 21 generates the typical model (step S11), the corner model generating part 22 generates the two corner models of the fast-side corner and the slow-side corner (step S12), and the ratio table generating part 23 generates the table of the ratio X (step S13). The table of the ratio X generated here is stored into the ratio table storage part 21. The ratio reading part 12 and the corner model forming part 13 carry out the same procedures as those in the example illustrated in FIG. 5. In this manner, the necessary corner models are formed.

The SPICE corner model generating method illustrated in FIG. 1 can be implemented with the use of the SPICE corner model generating apparatus of FIG. 5 or 6, but this method may also be implemented with the use of some other apparatuses.

As described above, in this embodiment, SPICE corner models of cases where the electrical characteristics of MOSFETS vary in opposite directions are formed with the use of the table of the ratio X of the magnitude of the opposite directional variations to the magnitude of the same directional variations. As the values of the ratios X are applied to skew corner models, the SPICE corner models can be relatively readily generated in this embodiment. Furthermore, the amount of data to be prepared beforehand to handle the opposite directional variations can be reduced, and the time required for reading the data can be shortened.

In the following, a second embodiment of the disclosure is described. The second embodiment is a modification of the first embodiment, and the aspects of the second embodiment that differ from those of the first embodiment are mainly explained.

(Second Embodiment)

Figure 7:
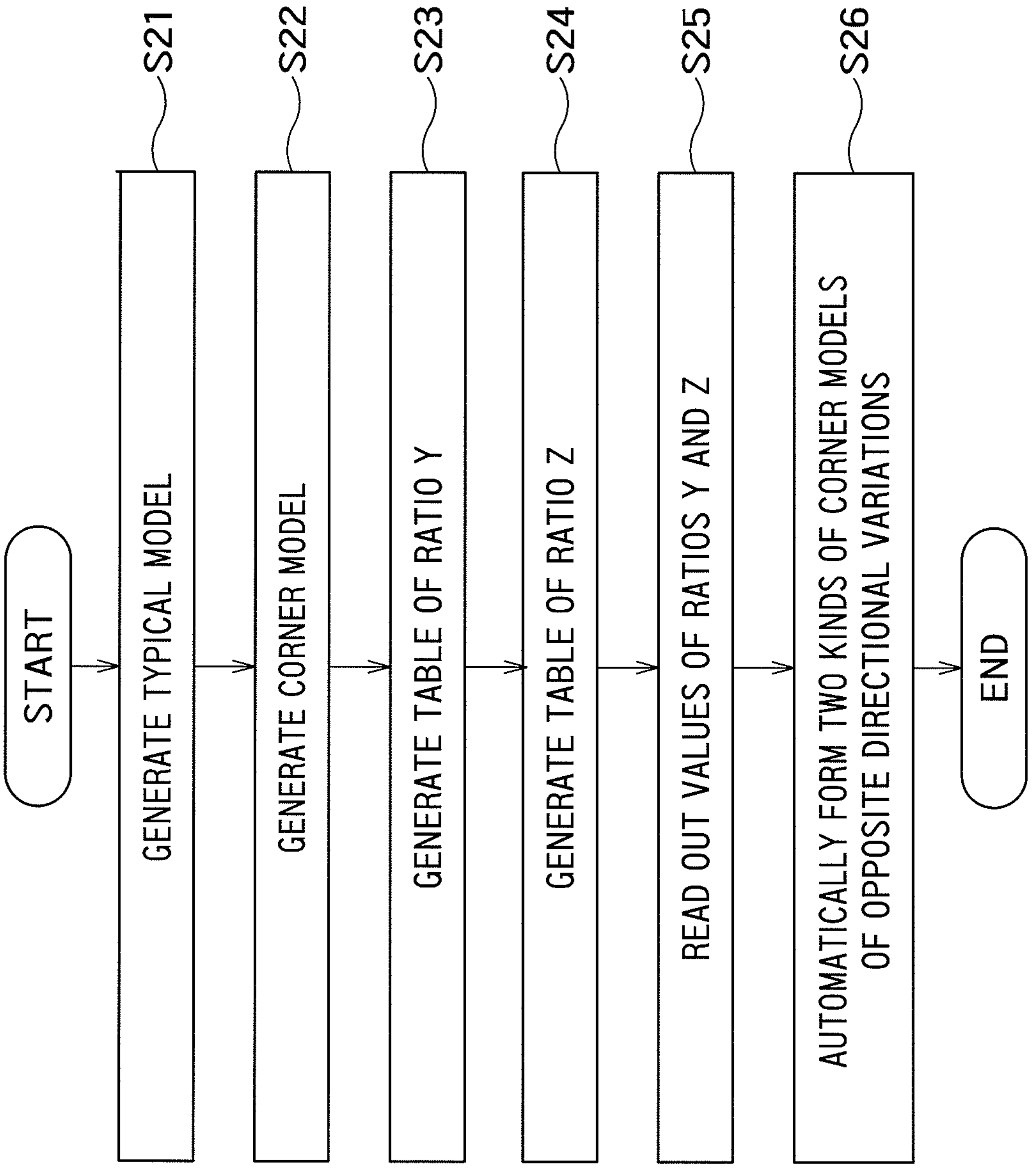
FIG. 7 is a flowchart for explaining a SPICE corner model generating method according to a second embodiment.

FIG. 7 is a flowchart for explaining a SPICE corner model generating method according to a second embodiment.

In this embodiment, an example case where one technology involves the later described lineup of MOSFETs is described as a typical example. In this lineup, there are two kinds of gate insulator thicknesses, i.e., a thin type and a thick type. There are three kinds of threshold voltages of thin-film MOSFETs, i.e., a low type, a medium type, and a high type. There are two kinds of threshold voltages of thick-film MOSFETs, i.e., a low type and a high type. There are an NFET and a PFET in each of the thin-film and thick-film MOSFETs. The lineup of MOSFETs in this case includes (3+2)×2=10 kinds, and the number of combinations of two kinds of MOSFETs is ${}_{10}C_2=45$.

In the flow illustrated in FIG. 7, corner models for verifying operations in which the opposite directional variations of arbitrary combinations of MOSFETs are taken into consideration are formed through the following procedures of steps S21 to S26. In the following, an example case where one technology involves ten kinds of MOSFETs is described.

However, this embodiment may also be applied to cases where one technology involves N kinds of MOSFETs, where N is an integer of 2 or greater.

First, at step S21, a typical model corresponding to a case where variations are not taken into consideration is generated for each of the ten kinds of MOSFETs. This step is the same as step S11.

At step S22, values of one or more model parameters of the typical model of each of the ten kinds of MOSFETs is varied, and corner models corresponding to a case where the electrical characteristics of the MOSFETs vary are generated. This step is the same as step S12. In this embodiment, the on-current is used as the indicator that defines the electrical characteristics of the MOSFETs.

There are two directions in which the electric characteristics of the respective MOSFETs vary, and at step S22, two corner models of the fast-side corner and the slow-side corner are generated for each of the ten kinds of MOSFETs. The model parameters having the values varied at step S22 are referred to as skew parameters, and the corner models generated at step S22 are referred to as skew corner models.

In this embodiment, at least the gate length L, the gate width W, the gate insulator thickness Tox, and the threshold voltage Vth0 (or the channel impurity concentration Nch) are used as the skew parameters. As for the gate insulator thickness Tox and the threshold voltage Vth0 (or the channel impurity concentration Nch), their variation widths are dynamically varied, so that the corner widths of the corner models become variable.

At step S23, as for an arbitrary combination of two kinds of MOSFETs selected from the ten kinds of MOSFETs, the correlation between the variations in the on-current value due to the variations in the channel impurity concentration Nch is examined. The channel impurity concentration Nch is an example of a first model parameter of the disclosure.

(1) First, where both of the two kinds of MOSFETs are NFETs or PFETs, it is considered that there is a correlation between the variations of the on-current values of those MOSFETs. This is because the impurity introducing process for forming the channel portion is shared (or partially shared) between the NFETs or PFETs.

In this case, the on-current value of one of the MOSFETs is indicated by the abscissa axis of two-dimensional coordinates, and the on-current value of the other MOSFET is indicated by the ordinate axis. The distribution of variations in the on-current value due to the variations in the channel impurity concentration Nch of the two kinds of MOSFETs is then examined. In other words, of the variations in the on-current value, only the components related to the variations in the channel impurity concentration Nch between the two kinds of MOSFETs are examined.

To examine the distribution of variations in the on-current value caused by the variations in the channel impurity concentration Nch, the distribution of variations may be theoretically estimated from the manufacture conditions related to the channel impurity introduction, or a simulation by TCAD may be used. Also, any other technique for examining the correlation between variations in the on-current value caused by the variations in the channel impurity concentration Nch may be used.

At step S23, as for the examined distribution of variations, the ratio Y between the magnitude of the same directional variations caused by the variation in the channel impurity concentration Nch and the magnitude of the opposite directional variations caused by the variations in Nch (Y is the value obtained by dividing the opposite directional variation width by the same directional variation width) is calculated. This step is the same as step S13. In a case where both of the two kinds of MOSFETs are NFETs or PFETs, the value of the ratio Y is considered to be in the range expressed as $0<Y\leqq 1$.

(2) Where the two kinds of MOSFETs are an NFET and a PFET, the correlation between variations in the on-current value of those MOSFETs is considered to be small. This is because the impurity introducing process for forming the channel portion of the NFET and the impurity introducing process for forming the channel portion of the PFET are normally independent of each other.

Therefore, where the two kinds of MOSFETs are an NFET and a PFET, the value of the ratio Y is automatically set to 1 in this embodiment. Where both of the two kinds of MOSFETs are NFETs or PFETs, on the other hand, the value of the ratio Y is considered to be in the range expressed as $0<Y\leqq 1$.

At step S23, a table of the ratio Y is generated, so as to hold information that contains values of the ratio Y calculated for arbitrary combinations. This step is the same as step S13. FIG. 8 is a diagram showing an example of a table of the ratio Y.

At step S24, as for an arbitrary combination of two kinds of MOSFETs selected from the ten kinds of MOSFETs, the correlation between variations in the on-current value caused by the variations in the gate insulator thickness Tox is considered as follows. The gate insulator thickness Tox is an example of a second model parameter of the disclosure.

(1) First, in a case where both of the two kinds of MOSFETs are thin-film MOSFETs or thick-film MOSFETs, the correlation between variations in the on-current value of those MOSFETs is considered to be very high (the correlation coefficient is 1). This is because the gate insulator forming process is normally shared between thin-film MOSFETs or thick-film MOSFETs. For example, since the gate insulator of an A-NFET and the gate insulator of a B-NFET are formed through the same process, the gate insulator of the B-NFET often becomes thicker (or thinner) than the reference value when the gate insulator of the A-NFET becomes thicker (or thinner) than the reference value.

At step S24, the ratio Z of the magnitude of the opposite directional variations caused by the variations in the gate insulator thickness Tox to the magnitude of the same directional variations caused by the variation in the gate insulator thickness Tox (Z is the value obtained by dividing the opposite directional variation width by the same directional variation width) is calculated. This step is the same as step S13.

In this embodiment, where both of the two kinds of MOSFETs are thin-film MOSFETs or thick-film MOSFETs, the value of the ratio Z is automatically set to 0.

(2) In a case where the two kinds of MOSFETs are a thin-film MOSFET and a thick-film MOSFET, the correlation between variations in the on-current value of those MOSFETs is considered to be very low (the correlation coefficient is 0). This is because the gate insulator forming process for the thin-film MOSFET and the gate insulator forming process for the thick-film MOSFET are normally independent of each other.

Therefore, where the two kinds of MOSFETs are a thin-film MOSFET and a thick-film MOSFET, the value of the ratio Z is automatically set to 1 in this embodiment.

At step S24, a table of the ratio Z is generated, so as to hold information that contains values of the ratio Z calculated for arbitrary combinations. This step is the same as step S13. FIG. 9 is a diagram showing an example of a table of the ratio Z.

At step S25, if a combination of two kinds of MOSFETs among the ten kinds is designated by a user or the like while a SPICE circuit simulation is being performed, the table of the ratio Y and the table of the ratio Z are referred to, and the values of the ratio Y and the ratio Z corresponding to the designated combination are read from the tables. This step is the same as step S14.

At step S26, as for the above two kinds of MOSFETs, the variation widths of the values of the channel impurity concentration Nch from the value of the typical model are multiplied by the ratio Y, and the variation widths of the values of the gate insulator thickness Tox from the value of the typical model are multiplied by the ratio Z. In this manner, the two kinds of corner models corresponding to the opposite directional variations are automatically formed.

At this point, the first corner model of the two kinds of corner models is formed by applying the value of the ratio Y and the value of the ratio Z to the fast-side corner of the first MOSFET of the two kinds of MOSFETs, and to the slow-side corner of the second MOSFET. More specifically, the first corner model is formed by combining a result obtained by multiplying the variation widths of the channel impurity concentration Nch and the gate insulator thickness Tox of the fast-side corner model of the first MOSFET by Y and Z respectively, with a result obtained by multiplying the variation widths of Nch and Tox of the slow-side corner model of the second MOSFET by Y and Z respectively.

Also, the second corner model of the two kinds of corner models is formed by applying the value of the ratio Y and the value of the ratio Z to the slow-side corner of the first MOSFET of the two kinds of MOSFETs, and to the fast-side corner of the second MOSFET. More specifically, the second corner model is formed by combining a result obtained by multiplying the variation widths of the channel impurity concentration Nch and the gate insulator thickness Tox of the slow-side corner model of the first MOSFET by Y and Z respectively, with a result obtained by multiplying the variation widths of Nch and Tox of the fast-side corner model of the second MOSFET by Y and Z respectively.

When the first and second corner models are formed, the variation widths of the values of the gate length L and the gate width W from the values of the typical model are 0.

In this manner, the two corner models corresponding to both sides of the opposite directional variations are formed at step S26. At step S26, the corner models generated at steps S21 and S22 are used as the typical model and the corner models, and the values that are generated at steps S23 and S24 and are read out at step S25 are used as the value of the ratio Y and the value of the ratio Z.

All the steps in the SPICE corner model generating method illustrated in FIG. 7 may be carried out by a computer, or the procedures of steps S25 and S26 may be carried out by a computer while the procedures of steps S21 to S24 are carried out by a human.

Like the method illustrated in FIG. 1, the SPICE corner model generating method illustrated in FIG. 7 can be implemented with the use of the SPICE corner model generating apparatus of FIG. 5 or 6, for example. In that case, however, the ratio table generating part 23 generates a table of the ratio Y and a table of the ratio Z, and the table of the ratio Y and the table of the ratio Z are stored in the ratio table storage part 11. The ratio reading part 12 reads a value of the ratio Y and a value of the ratio Z. The corner model forming part 13 automatically forms the two kinds of corner models corresponding to the opposite directional variations, using the value of the ratio Y and the value of the ratio Z. In this manner, the necessary corner models are formed.

As described above, the SPICE corner model generating method illustrated in FIG. 7 can be implemented with the use of the SPICE corner model generating apparatus of FIG. 5 or 6, for example. However, this method may be implemented with the use of some other apparatuses.

As described above, in this embodiment, SPICE corner models of a case where the electrical characteristics of MOSFETs vary in opposite directions are formed with the use of the tables of the ratios Y and Z of the magnitudes of the opposite directional variations to the magnitudes of the same directional variations. Accordingly, such SPICE corner models can be relatively readily generated in this embodiment by applying the values of ratios Y and Z to the skew corner models. Furthermore, the amount of data to be prepared beforehand for handling the opposite directional variations can be reduced, and the data reading time can be shortened.

Also, in this embodiment, the values of the ratios Y and Z may be automatically regarded as 0 or 1 under certain conditions, as in steps S23 and S24. In other words, under certain conditions, the values of ratios Y and Z are not actually calculated, and those values may be automatically set to 0 or 1. Accordingly, the values of ratios Y and Z under such conditions can be readily calculated in this embodiment. Such an operation may be applied to the ratios X in the first embodiment.

The procedures of steps S23 and S24 may be performed in this order, or in the reverse order, step S24 followed by step S23.

In the flow illustrated in FIG. 7, two tables of ratios are generated and used, with the variations of two kinds of model parameters being taken into consideration. In this embodiment, however, M (M being an integer of 1 or greater) tables of ratios may be generated and used, with the variations of M kinds of model parameters being taken into consideration.

In the first and second embodiments, the variations in the on-current are taken as an example of the variations in the electrical characteristics of MOSFETs. However, those embodiments may be applied to variations in some other electrical characteristics. Examples of those electrical characteristics include the threshold voltage and the leakage current in an off-state.

In the first and second embodiments, the ratio of the opposite directional variations to the same directional variations is examined based on the two-dimensional distribution of the on-currents of two kinds of MOSFETs. In a case where there are three kinds of MOSFETs instead of two kinds, it is possible to examine the ratio of the variations observed in a case where the on-current of one kind varies in opposite directions while the on-currents of the other two vary in the same directions, to the variations observed in a case where the on-currents of the three kinds vary in the same directions. In such a case, a table of the ratio is generated, and is referred to when the necessary corner models are formed. As described above, the number of kinds of MOSFETs for which variations are taken into consideration at the same time may be two or k (k being an integer of 3 or greater).

As described so far, each embodiment of the disclosure can provide a SPICE corner model generating method and apparatus that are capable of generating relatively readily the SPICE corner models in cases where the electrical characteristics of MOSFETs vary in opposite directions.

While certain embodiments have been described, these embodiments have been presented by way of example only, and are not intended to limit the scope of the inventions. Indeed, the novel methods and apparatuses described herein may be embodied in a variety of other forms; furthermore, various omissions, substitutions and changes in the form of the methods and apparatuses described herein may be made without departing from the spirit of the inventions. The accompanying claims and their equivalents are intended to cover such forms or modifications as would fall within the scope and spirit of the inventions.

The invention claimed is:

1. A Simulation Program with Integrated Circuit Emphasis (SPICE) corner model generating method for generating a SPICE corner model of a metal-oxide-semiconductor field-effect transistor (MOSFET), the method comprising:

preparing a table of a ratio X regarding a combination of two kinds of MOSFETs selected from N kinds of MOSFETs, the ratio X being a magnitude of a variation of a MOSFET in a case where directions of variations of the two kinds of MOSFETs are opposite directions to a magnitude of a variation of a MOSFET in a case where the directions of the variations of the two kinds of MOSFETs are the same direction, where N is an integer of 2 or greater;

reading out, when a combination of two kinds of MOSFETs is designated among the N kinds of MOSFETs, a value of the ratio X corresponding to the designated combination from the table of the ratio X; and forming two kinds of corner models of opposite directional variations, the two kinds of corner models comprising a first corner model generated by applying the value of the ratio X to a fast-side corner of a first MOSFET of the two kinds of MOSFETs and to a slow-side corner of a second MOSFET of the two kinds of MOSFETs, and a second corner model generated by applying the value of the ratio X to a slow-side corner of the first MOSFET and to a fast-side corner of the second MOSFET.

2. The method of claim 1, further comprising:

generating a typical model for each of the N kinds of MOSFETs;

generating a fast-side corner model and a slow-side corner model for each of the N kinds of MOSFETs by varying a value of a model parameter of the typical model; and generating the table of the ratio X for the combination of two kinds of MOSFETs selected from the N kinds of MOSFETs.

3. The method of claim 1, wherein the first corner model is formed by combining a result obtained by multiplying a variation width of a model parameter of the fast-side corner model of the first MOSFET by X, with a result obtained by multiplying a variation width of the model parameter of the slow-side corner model of the second MOSFET by X, and the second corner model is formed by combining a result obtained by multiplying a variation width of the model parameter of the slow-side corner model of the first MOSFET by X, with a result obtained by multiplying a variation width of the model parameter of the fast-side corner model of the second MOSFET by X.

4. The method of claim 3, wherein the model parameter is at least one of a gate length, a gate width, a gate insulator thickness, a threshold voltage, and a channel impurity concentration of the first or second MOSFET.

5. The method of claim 3, wherein the same ratio X is applied to a plurality of model parameters of the first and second MOSFETs.

6. The method of claim 1, wherein the first and second corner models are formed dynamically when a circuit simulation is performed.

7. A SPICE corner model generating method for generating a SPICE corner model of a MOSFET, the method comprising:

preparing a table of a ratio Y regarding a combination of two kinds of MOSFETs selected from N kinds of MOSFETs, the ratio Y being a magnitude of a variation of a MOSFET in a case where directions of variations of the two kinds of MOSFETs due to a variation of a first model parameter are opposite directions to a magnitude of a variation of a MOSFET in a case where the directions of the variations of the two kinds of MOSFETs due to the variation of the first model parameter are the same direction, where N is an integer of 2 or greater;

preparing a table of a ratio Z regarding a combination of two kinds of MOSFETs selected from the N kinds of MOSFETs, the ratio Z being a magnitude of a variation of a MOSFET in a case where directions of variations of the two kinds of MOSFETs due to a variation of a second model parameter are opposite directions to a magnitude of a variation of a MOSFET in a case where the directions of the variations of the two kinds of MOSFETs due to the variation of the second model parameter are the same direction;

reading out, when a combination of two kinds of MOSFETs is designated among the N kinds of MOSFETs, values of the ratios Y and Z corresponding the designated combination from the tables of the ratios Y and Z; and forming two kinds of corner models of opposite directional variations, the two kinds of corner models comprising a first corner model generated by applying the values of the ratios Y and Z to a fast-side corner of a first MOSFET of the two kinds of MOSFETs and to a slow-side corner of a second MOSFET of the two kinds of MOSFETs, and a second corner model generated by applying the values of the ratios Y and Z to a slow-side corner of the first MOSFET and to a fast-side corner of the second MOSFET.

8. The method of claim 7, further comprising:

generating a typical model for each of the N kinds of MOSFETs;

generating a fast-side corner model and a slow-side corner model for each of the N kinds of MOSFETs by varying a value of a model parameter of the typical model; and generating the tables of the ratios Y and Z for the combinations of two kinds of MOSFETs selected from the N kinds of MOSFETs.

9. The method of claim 8, wherein the first model parameter is a channel impurity concentration of each MOSFET, and the value of the ratio Y is automatically set to 1 in forming the table of the ratio Y if the two kinds of MOSFETs are an NFET and a PFET.

10. The method of claim 8, wherein the second model parameter is a gate insulator thickness of each MOSFET, and the value of the ratio Z is automatically set to 0 in forming the table of the ratio Z if gate insulators of the two kinds of MOSFETs are both thin films or thick films.

11. The method of claim 8, wherein the second model parameter is a gate insulator thickness of each MOSFET, and the value of the ratio Z is automatically set to 1 in forming the table of the ratio Z if gate insulators of the two kinds of MOSFETs are a thin film and a thick film.

12. The method of claim 7, wherein the first corner model is formed by combining a result obtained by multiplying variation widths of the first and second model parameters of the fast-side corner model of the first MOSFET by Y and Z, with a result obtained by multiplying variation widths of the first and second model parameters of the slow-side corner model of the second MOSFET by Y and Z, and the second corner model is formed by combining a result obtained by multiplying variation widths of the first and second model parameters of the slow-side corner model of the first MOSFET by Y and Z, with a result obtained by multiplying variation widths of the first and second model parameters of the fast-side corner model of the second MOSFET by Y and Z.

13. The method of claim 7, wherein the first and second corner models are formed dynamically when a circuit simulation is performed.

14. A SPICE corner model generating apparatus configured to generate a SPICE corner model of a MOSFET, the apparatus comprising:

a ratio table storage module configured to store a table of a ratio X regarding a combination of two kinds of MOSFETs selected from N kinds of MOSFETs, the ratio X being a magnitude of a variation of a MOSFET in a case where directions of variations of the two kinds of MOSFETs are opposite directions to a magnitude of a variation of a MOSFET in a case where the directions of the variations of the two kinds of MOSFETs are the same direction, where N is an integer of 2 or greater;

a ratio reader configured to read out, when a combination of two kinds of MOSFETs is designated among the N kinds of MOSFETs, a value of the ratio X corresponding to the designated combination from the table of the ratio X; and a corner model forming module configured to form two kinds of corner models of opposite directional variations, the two kinds of corner models comprising a first corner model generated by applying the value of the ratio X to a fast-side corner of a first MOSFET of the two kinds of MOSFETs and to a slow-side corner of a second MOSFET of the two kinds of MOSFETs, and a second corner model generated by applying the value of the ratio X to a slow-side corner of the first MOSFET and to a fast-side corner of the second MOSFET.

15. The apparatus of claim 14, further comprising:

a typical model generator configured to generate a typical model for each of the N kinds of MOSFETs;

a corner model generator configured to generate a fast-side corner model and a slow-side corner model for each of the N kinds of MOSFETs by varying a value of a model parameter of the typical model; and a ratio table generator configured to generate the table of the ratio X for the combination of two kinds of MOSFETs selected from the N kinds of MOSFETs.

16. The apparatus of claim 14, wherein the first corner model is formed by combining a result obtained by multiplying a variation width of a model parameter of the fast-side corner model of the first MOSFET by X, with a result obtained by multiplying a variation width of the model parameter of the slow-side corner model of the second MOSFET by X, and the second corner model is formed by combining a result obtained by multiplying a variation width of the model parameter of the slow-side corner model of the first MOSFET by X, with a result obtained by multiplying a variation width of the model parameter of the fast-side corner model of the second MOSFET by X.

17. The apparatus of claim 16, wherein the model parameter is at least one of a gate length, a gate width, a gate insulator thickness, a threshold voltage, and a channel impurity concentration of the first or second MOSFET.

18. The apparatus of claim 16, wherein the same ratio X is applied to a plurality of model parameters of the first and second MOSFETs.

19. The apparatus of claim 14, wherein the corner model forming module is configured to dynamically form the first and second corner models when a circuit simulation is performed.

* * * * *